(12) United States Patent
Kim

(10) Patent No.: US 7,361,550 B2
(45) Date of Patent: Apr. 22, 2008

(54) METHODS OF FABRICATING SEMICONDUCTOR MEMORY DEVICES INCLUDING ELECTRODE CONTACT STRUCTURES HAVING REDUCED CONTACT RESISTANCE

(75) Inventor: Si-youn Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 133 days.

(21) Appl. No.: 11/185,559

(22) Filed: Jul. 20, 2005

(65) Prior Publication Data

US 2006/0081913 A1 Apr. 20, 2006

(30) Foreign Application Priority Data

Oct. 20, 2004 (KR) ............... 10-2004-0083972

(51) Int. Cl.
*H01L 21/8242* (2006.01)
(52) U.S. Cl. .......... 438/253; 438/254; 257/E21.657
(58) Field of Classification Search ........ 438/244, 438/253, 254; 257/E21.657
See application file for complete search history.

(56) References Cited

U.S. PATENT DOCUMENTS

| | | | |
|---|---|---|---|
| 5,140,389 A | | 8/1992 | Kimura et al. |
| 5,940,714 A | * | 8/1999 | Lee et al. ............ 438/396 |
| 6,214,715 B1 | * | 4/2001 | Huang et al. ........ 438/597 |
| 6,613,664 B2 | * | 9/2003 | Barth et al. ......... 438/629 |
| 6,621,110 B1 | | 9/2003 | Matsuoka et al. |
| 6,861,690 B2 | | 3/2005 | Park |
| 2001/0001211 A1 | | 5/2001 | Tanaka et al. |
| 2001/0046151 A1 | * | 11/2001 | Takeda et al. ......... 365/63 |
| 2002/0096701 A1 | * | 7/2002 | Torii et al. ......... 257/296 |
| 2003/0054634 A1 | * | 3/2003 | Lee et al. ........... 438/675 |
| 2003/0107073 A1 | * | 6/2003 | Iijima et al. ........ 257/296 |
| 2003/0151083 A1 | * | 8/2003 | Matsui et al. ....... 257/310 |
| 2005/0218440 A1 | * | 10/2005 | Park .................. 257/298 |

FOREIGN PATENT DOCUMENTS

| | | |
|---|---|---|
| JP | 2000-353793 | 12/2000 |
| KR | 2001-0017558 A | 3/2001 |
| KR | 2001-0037878 A | 5/2001 |
| KR | 2002-013809 A | 2/2002 |

OTHER PUBLICATIONS

Notice to Submit Response corresponding to Korean Patent Application No. 10-2004-0083972 mailed Feb. 24, 2006.

* cited by examiner

*Primary Examiner*—Phat X Cao
(74) *Attorney, Agent, or Firm*—Myers Bigel Sibley & Sajovec, PA

(57) ABSTRACT

A semiconductor memory device includes a semiconductor substrate having an active region therein, an insulating layer on the substrate, and a lower electrode conductive pad extending through the insulating layer. The lower electrode conductive pad electrically contacts the active region at a lower surface of the lower electrode conductive pad. A lower electrode conductive plug on at least a portion of the lower electrode conductive pad electrically contacts the lower electrode conductive pad at an upper surface and at one sidewall thereof. The semiconductor device may further include a bitline conductor on the substrate adjacent the lower electrode conductive plug and an insulating spacer on a sidewall of the bitline conductor adjacent the lower electrode conductive plug. The insulating spacer may separate the lower electrode conductive plug from the bitline conductor by a distance sufficient to prevent electrical contact therebetween. Related methods are also discussed.

11 Claims, 10 Drawing Sheets

METHODS OF FABRICATING SEMICONDUCTOR MEMORY DEVICES INCLUDING ELECTRODE CONTACT STRUCTURES HAVING REDUCED CONTACT RESISTANCE

CROSS-REFERENCE TO RELATED APPLICATION

This application claims priority from Korean Patent Application No. 10-2004-0083972, filed on Oct. 20, 2004, in the Korean Intellectual Property Office, the disclosure of which is hereby incorporated by reference herein in its entirety.

BACKGROUND OF THE INVENTION

The present invention relates to semiconductor memory devices, and more particularly, to electrode contact structures in semiconductor memory devices and methods of fabricating the same.

Many efforts have been made to improve the performance of semiconductor memory devices. In particular, various techniques have been introduced to improve conventional equal-interval matrix type memory cells, such as folded bitline structure memory cells. For example, diagonal memory cells have been developed. In a diagonal memory cell, the bitlines extend in an oblique direction relative to an active region, forming an oblique angle therebetween.

However, in a cell structure where the bitlines are oblique relative to the active region, the distance between lower electrode contact structures for capacitors may be decreased. This decreased distance between the lower electrode contacts may cause problems. In particular, due to the decreased distance between contacts, the lower electrode contacts may electrically contact the bitlines, which may cause a short circuit. U.S. Pat. No. 6,621,110 to Matsuoka et al. discloses a semiconductor integrated circuit device and a method of manufacturing the same that may address some of these problems.

FIG. 1 is a plan view of a conventional semiconductor memory device having lower electrode contact structures as shown in U.S. Pat. No. 6,621,110. FIG. 2 is a cross-sectional view taken along line II-II of FIG. 1.

Referring now to FIGS. 1 and 2, a first interlayer insulating layer 30, a second interlayer insulating layer 32, and a third interlayer insulating layer 34 are sequentially deposited on a semiconductor substrate 10 having an active region 14 therein. The active region 14 is defined by a device isolation region 12. The first interlayer insulating layer 30 includes a lower electrode contact pad 16. The second interlayer insulating layer 32 includes a TiN layer 18. The TiN layer 18 may function as an adhesive layer, connecting the lower electrode contact pad 16 to a bitline 20 formed on an upper surface of the second interlayer insulating layer 32. The second interlayer insulating layer 32 and the third interlayer insulating layer 34 include a lower electrode contact plug 22 electrically connecting the lower electrode contact pad 16 to a capacitor lower electrode (not shown). The bitline 20 extends in an oblique direction relative to a word line 2 that is perpendicular to the active region 14.

The distance between centers of adjacent contact plugs 22 on opposite sides of the bitline 20 is greater than 2 F, where F is the width of the word line 2 and/or the bitline 20. The diameter of the lower electrode contact plug 22 is less than that of the lower electrode contact pad 16. As such, the lower electrode contact plug 22 may be formed off-center on the lower electrode contact pad 16 in order to increase the distance between the lower electrode contact plug 22 and the bitline 20. Thus, electrical contact (i.e., a short circuit) between the bitline 20 and the lower electrode contact plug 22 may be prevented. Since the diameter of the lower electrode contact plug 22 is less than that of the lower electrode contact pad 16, sufficient contact between the plug 22 and the pad 16 can be maintained without an increase in contact resistance.

However, where the distance between centers of the lower electrode contact plugs 22 is less than 2 F, it may be difficult to maintain a distance between the lower electrode contact plugs 22 and the bitlines 20 sufficient to prevent electrical contact therebetween. In addition, it may be difficult to maintain sufficient contact area between the lower electrode contact pad 16 and the lower electrode contact plug 22, even if the lower electrode contact plug 22 is formed using self-alignment techniques. More particularly, sufficient contact may not be maintained when a misalignment between the lower electrode contact pad 16 and the lower electrode contact plug 22 is greater than about 15 nm. In other words, when the lower electrode contact plug 22 extends beyond (i.e., overhangs) an edge of the lower electrode contact pad 16 by more than about 15 nm, contact resistance may be increased due to the reduction in contact area.

SUMMARY OF THE INVENTION

According to some embodiments of the present invention, a semiconductor memory device includes a semiconductor substrate having an active region therein and an insulating layer on the substrate. A lower electrode conductive pad extends through the insulating layer and electrically contacts the active region at a lower surface thereof. A lower electrode conductive plug on at least a portion of the lower electrode conductive pad electrically contacts the lower electrode conductive pad at an upper surface and at one sidewall thereof. The device may further include a bitline conductor on the substrate adjacent the lower electrode conductive plug and an insulating spacer on a sidewall of the bitline conductor adjacent the lower electrode conductive plug. The insulating spacer may separate the lower electrode conductive plug from the bitline conductor by a distance sufficient to prevent electrical contact therebetween.

In some embodiments, the bitline conductor is on at least a portion of the upper surface of the lower electrode conductive pad opposite the lower electrode conductive plug and spaced apart therefrom by the insulating spacer. The insulating spacer may include a first insulating spacer on the sidewall of the bitline conductor, and a second insulating spacer on the sidewall of the bitline conductor between the lower electrode conductive plug and the first insulating spacer. The first and second insulating spacers may separate the bitline conductor from the lower electrode conductive plug by a distance sufficient to prevent electrical contact therebetween.

In other embodiments, the insulating layer may have a recess therein adjacent the sidewall of the lower electrode conductive pad. The lower electrode conductive plug may extend into the recess in the insulating layer. In addition, the sidewall of the lower electrode conductive pad may be oblique to the upper surface of the lower electrode conductive pad, and the upper surface of the lower electrode conductive pad may be wider than the lower surface thereof. The semiconductor memory device may further include a residual insulating layer between the lower electrode conductive plug and the oblique sidewall of the lower electrode conductive pad.

In some embodiments, a distance between the bitline conductor and a center of the lower electrode conductive plug may be greater than a distance between the bitline conductor and a center of the lower electrode conductive pad. In addition, the lower electrode conductive plug may extend beyond an edge of the lower electrode conductive pad by more than about 15 nm.

In other embodiments, the insulating layer may be a first interlayer insulating layer. The semiconductor memory device may further include a second interlayer insulating layer between the bitline conductor and the substrate, and a third interlayer insulating layer between the bitline conductor and the lower electrode conductive plug.

In still other embodiments, the bitline conductor may be oblique relative to the active region of the semiconductor substrate.

According to some embodiments of the present invention, a method of fabricating a semiconductor memory device includes forming an insulating layer on a semiconductor substrate having an active region therein. A lower electrode conductive pad is formed extending through the insulating layer such that the lower electrode conductive pad electrically contacts the active region at a lower surface thereof. A lower electrode conductive plug is formed on at least a portion of the lower electrode conductive pad such that the lower electrode conductive plug electrically contacts the lower electrode conductive pad at an upper surface and at one sidewall thereof. A bitline conductor may also be formed on the substrate, and an insulating spacer may be formed on a sidewall of the bitline conductor. The insulating spacer may separate the bitline conductor from the lower electrode conductive plug by a distance sufficient to prevent electrical contact therebetween.

In some embodiments, the bitline conductor may be formed on at least a portion of the upper surface of the lower electrode conductive pad opposite the lower electrode conductive plug and spaced apart therefrom by the insulating spacer. The insulating spacer may be formed by forming a first insulating spacer on the sidewall of the bitline conductor, and forming a second insulating spacer on the sidewall of the bitline conductor adjacent the first insulating spacer. The first and second insulating spacers may separate the bitline conductor from the lower electrode conductive plug by a distance sufficient to prevent electrical contact therebetween.

In other embodiments, the lower electrode conductive plug may be formed by first forming a recess in the insulating layer adjacent the sidewall of the lower electrode conductive pad. The lower electrode conductive plug may be formed in the recess in the insulating layer such that the lower electrode conductive plug electrically contacts the lower electrode conductive pad at the upper surface and sidewall thereof. The lower electrode conductive pad may be formed having sidewalls that are oblique to the upper surface of the lower electrode conductive pad, such that the upper surface of the lower electrode conductive pad is wider than the lower surface thereof.

In some embodiments, the insulating spacer may be formed by forming a silicon nitride layer on the sidewall of the bitline conductor and in the recess in the insulating layer, and then removing at least a portion of the silicon nitride layer from the recess using an anisotropic etching process prior to forming the lower electrode conductive plug. As such, the insulating spacer may be formed in the the recess in the insulating layer, and a residual insulating layer may be formed in the recess in the insulating layer adjacent the sidewall of the lower electrode conductive pad.

In other embodiments, the insulating layer may be a first interlayer insulating layer. The method may further include forming a second interlayer insulating layer on the substrate prior to forming the bitline conductor, and forming a third interlayer insulating layer on an upper surface and sidewalls of the bitline conductor. The recess in the insulating layer may be formed by selectively etching the third, second, and first interlayer insulating layers. The etch selectivity of the second and third interlayer insulating layers relative to that of the first interlayer insulating layer may be about 1:0.5 to 1:5.

In some embodiments, the lower electrode conductive plug may be formed on the lower electrode conductive pad such that the lower electrode conductive plug may extend beyond an edge of the lower electrode conductive pad by more than about 15 nm. As such, a distance between the bitline conductor and a center of the lower electrode conductive plug may be greater than a distance between the bitline conductor and a center of the lower electrode conductive pad.

In still other embodiments, the bitline conductor may be formed oblique relative to the active region of the semiconductor substrate.

DETAILED DESCRIPTION OF THE INVENTION

Figure 1:
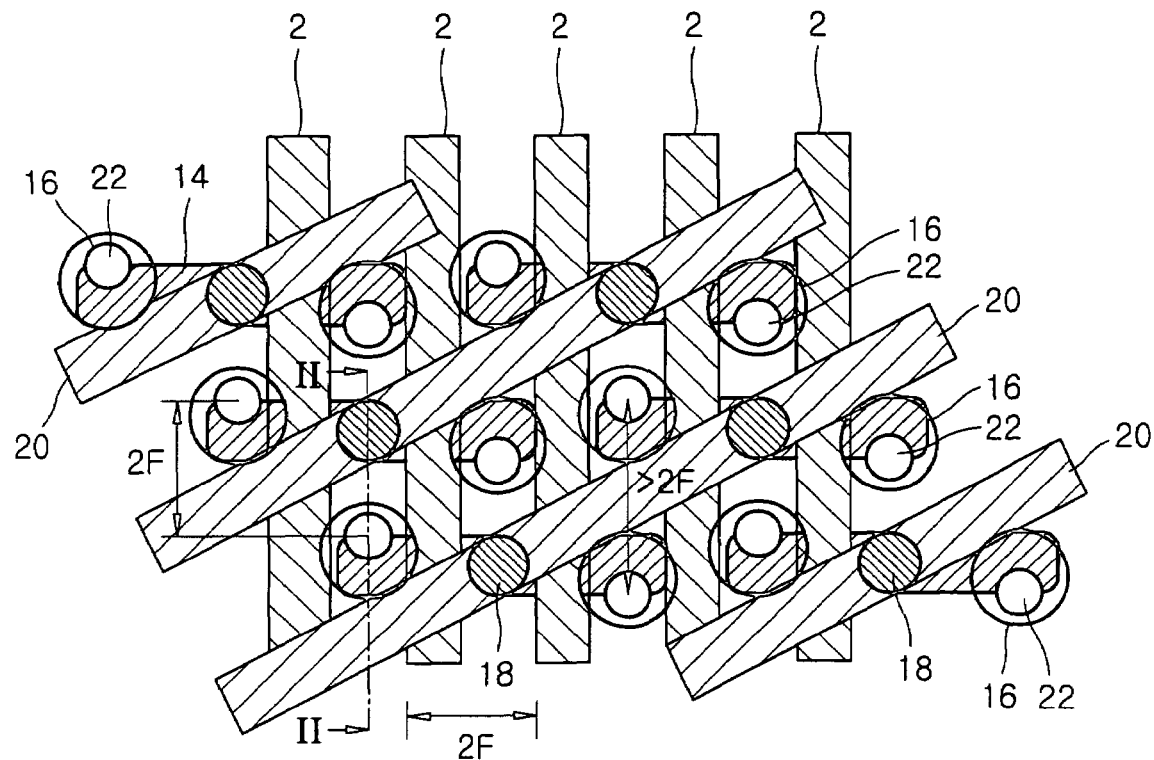
FIG. 1 is a plan view of a conventional semiconductor memory device including lower electrode contact structures.
Figure 2:
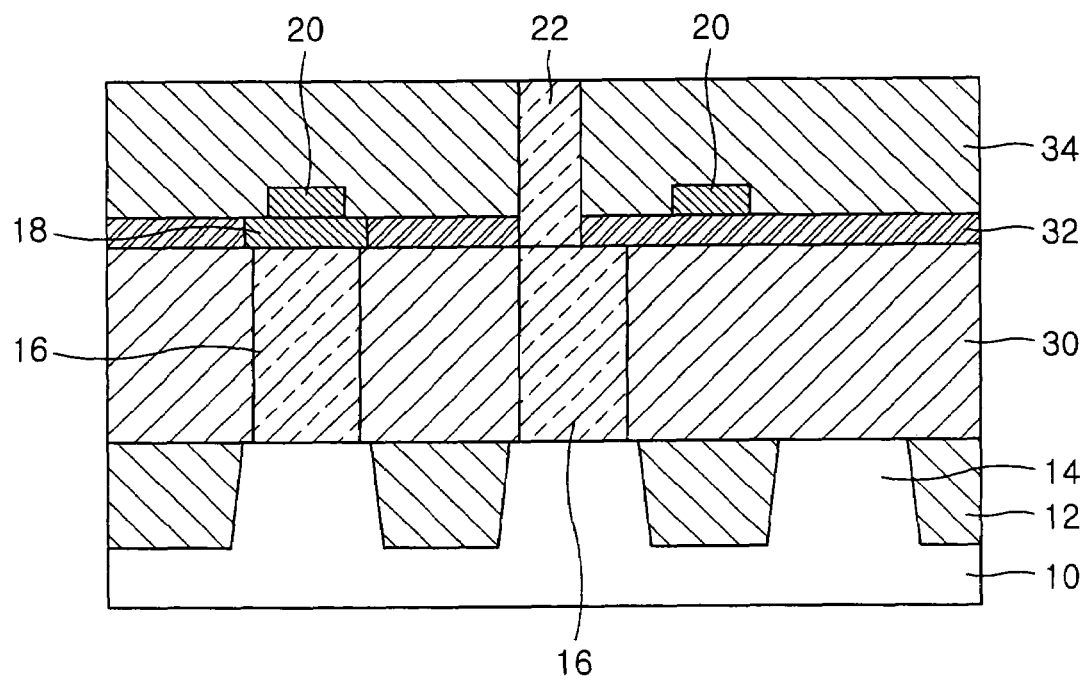
FIG. 2 is a cross-sectional view of a conventional semiconductor memory device taken along line II-II shown in FIG. 1.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items, and may be abbreviated as "/".

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 3:
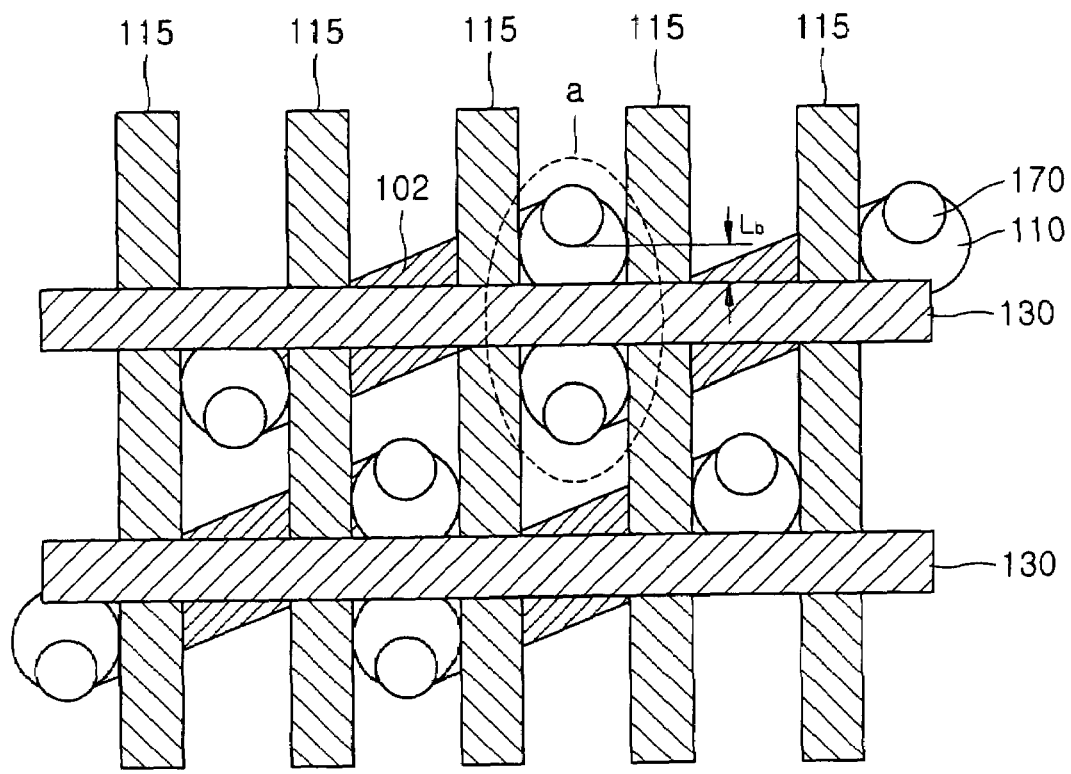
FIG. 3 is a plan view of a semiconductor memory device including lower electrode contact structures according to some embodiments of the present invention.
Figure 4:
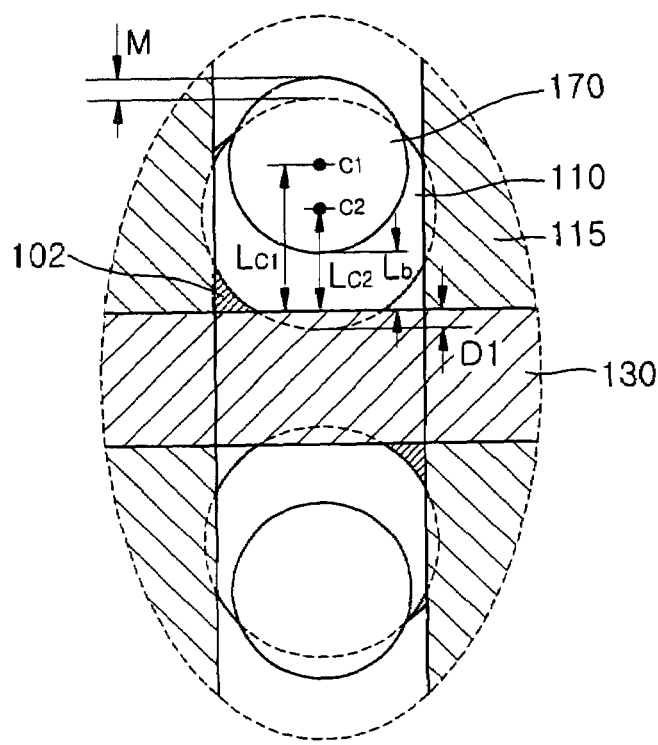
FIG. 4 is an enlarged view of a portion "a" of FIG. 3.

FIG. 3 is a plan view of a semiconductor memory device including lower electrode contact structures according to some embodiments of the present invention. FIG. 4 is an enlarged view of a portion "a" of FIG. 3;

Referring to FIGS. 3 and 4, a lower electrode contact pad 110 (also referred to herein as a lower electrode conductive pad) and a lower electrode contact plug 170 (also referred to herein as a lower electrode conductive plug) are formed at both ends of an active region 102 of a semiconductor substrate. The active region 102 extends in a diagonal and/or oblique direction relative to a bitline 130, forming an oblique angle therebetween. A word line 115 extends perpendicular to the bitline 130.

As shown in FIG. 4, a portion of the bitline 130 overlaps a portion of the lower electrode contact pad 110 by a width D1. The lower electrode contact plug 170, which is separated from the bitline 130 by a predetermined distance $L_b$, is formed on the lower electrode contact pad 110. The distance $L_b$ is provided to prevent and/or reduce the likelihood of electrical contact (i.e., an electric short) between the lower electrode contact plug 170 and the bitline 130. In addition, when the distances between the bitline 130 and lower electrode contact plugs 170 on opposite sides of the bitline 130 are approximately equal to each other, a desired capacitance between the lower electrode contact plugs 170 and the bitline 130 can be maintained.

A distance $L_{C1}$ between a sidewall of the bitline 130 and a center C1 of the lower electrode contact plug 170 is greater than a distance $L_{C2}$ between the sidewall of the bitline 130 and a center C2 of the lower electrode contact pad 110. Where $L_{C1} > L_{C2}$, the distance $L_b$ between the bitline 130 and the lower electrode contact plug 170 is sufficient to prevent and/or reduce the likelihood of shorting the lower electrode contact plug 170 to the bitline 130. Furthermore, a misalignment M between the lower electrode contact plug 170 and the lower electrode contact pad 110 (i.e., where the lower electrode conductive plug 170 extends beyond an edge of the lower electrode conductive pad 110) may be more than about 15 nm, as will be discussed in further detail below.

FIGS. 5 through 12 are cross-sectional views illustrating semiconductor memory devices according to some embodiments of the present invention during exemplary intermediate fabrication steps thereof according to some embodiments of the present invention.

Figure 5:
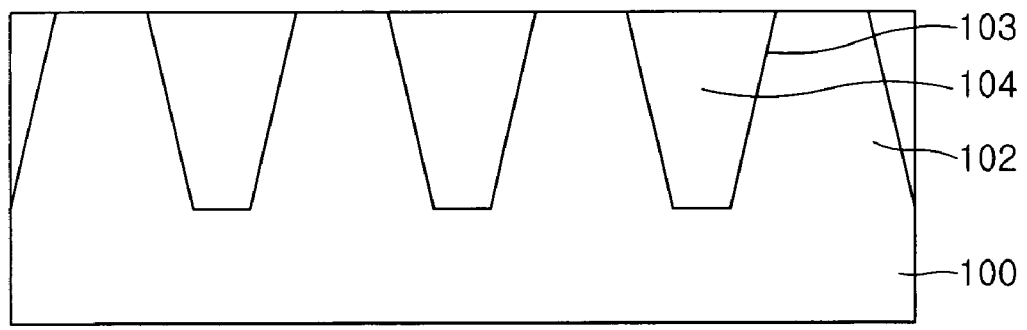
FIGS. 5 through 12 are cross-sectional views illustrating semiconductor memory devices according to some embodiments of the present invention during intermediate fabrication steps thereof according to some embodiments of the present invention.

Referring now to FIG. 5, a pad oxide layer (not shown) and a nitride layer (not shown) are sequentially formed on an integrated circuit substrate 100. The integrated circuit substrate 100 may be, for example, a silicon substrate. The pad oxide layer may reduce stress between the integrated circuit substrate 100 and the nitride layer. The pad oxide layer may be formed to a thickness of 20 to 2000 Å, for example, about 100 Å. The nitride layer may be used as a hard mask when a trench region is formed. The nitride layer may be formed by depositing silicon nitride to a thickness of 500 to 200 Å, for example, 800 to 850 Å. The deposition method may be, for example, chemical vapor deposition (CVD), sub-atmospheric CVD (SACVD), low pressure CVD (LPCVD), and/or plasma enhanced CVD (PECVD).

Subsequently, a photoresist pattern (not shown) for defining an active region 102 is formed on the substrate. The nitride layer and the pad oxide layer are then dry etched using the photoresist pattern as an etching mask to form a pad mask (not shown). More particularly, the nitride layer may be etched using a fluorinated carbon gas in an Ar gas atmosphere. The fluorinated carbon gas may be, for example, a CxFy gas, a CaHbFc gas, and/or a mixture of these gases.

The photoresist pattern is then removed, and the exposed portion of the integrated circuit substrate 100 is anisotropically etched using the pad mask as an etch mask to form a trench 103, thereby defining the active region 102 on the substrate 100. The trench 103 is filled with a gap-filling layer to form a trench isolation region 104.

Figure 6:
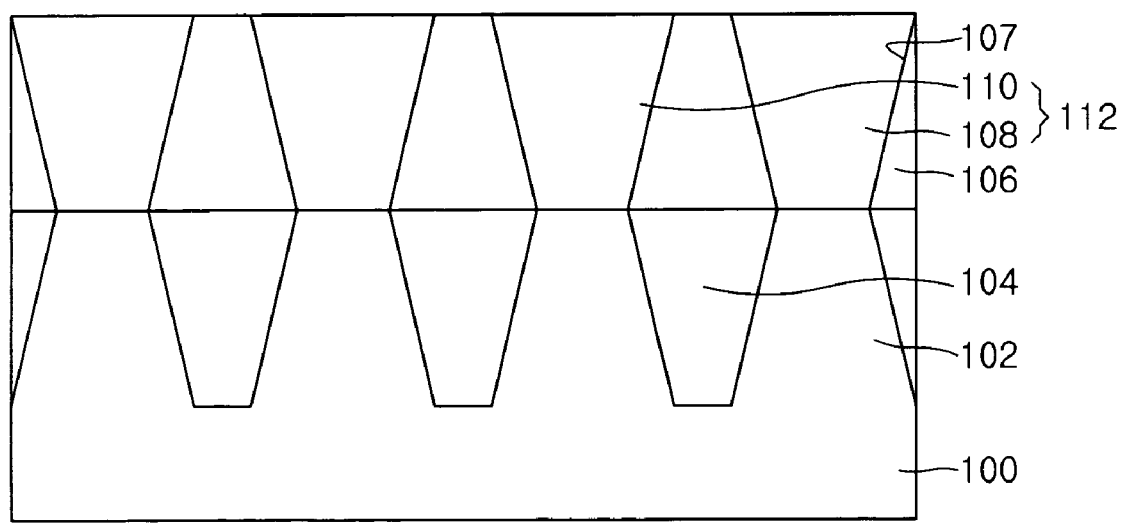

Referring now to FIG. 6, a first interlayer insulating layer 106 is formed on the upper surface of the integrated circuit substrate 100 including the active region 102. Then, the first interlayer insulating layer 106 is etched using conventional methods to form contact pad openings 107, thereby exposing the active region 102. The contact pad openings 107 are filled with a conductive material to form contact pads 112. The contact pads 112 include a bitline contact pad 108 for electrical contact with a bitline, and a lower electrode contact pad 110 for electrical contact with a lower electrode of a capacitor. The lower electrode contact pad 110 extends through the first interlayer insulating layer 106 and is electrically connected with the active region 102 at a lower surface thereof. The contact pads 112 may have slanted and/or oblique sidewalls, such that upper surfaces of the contact pads 112 are wider than lower surfaces thereof.

Figure 7:
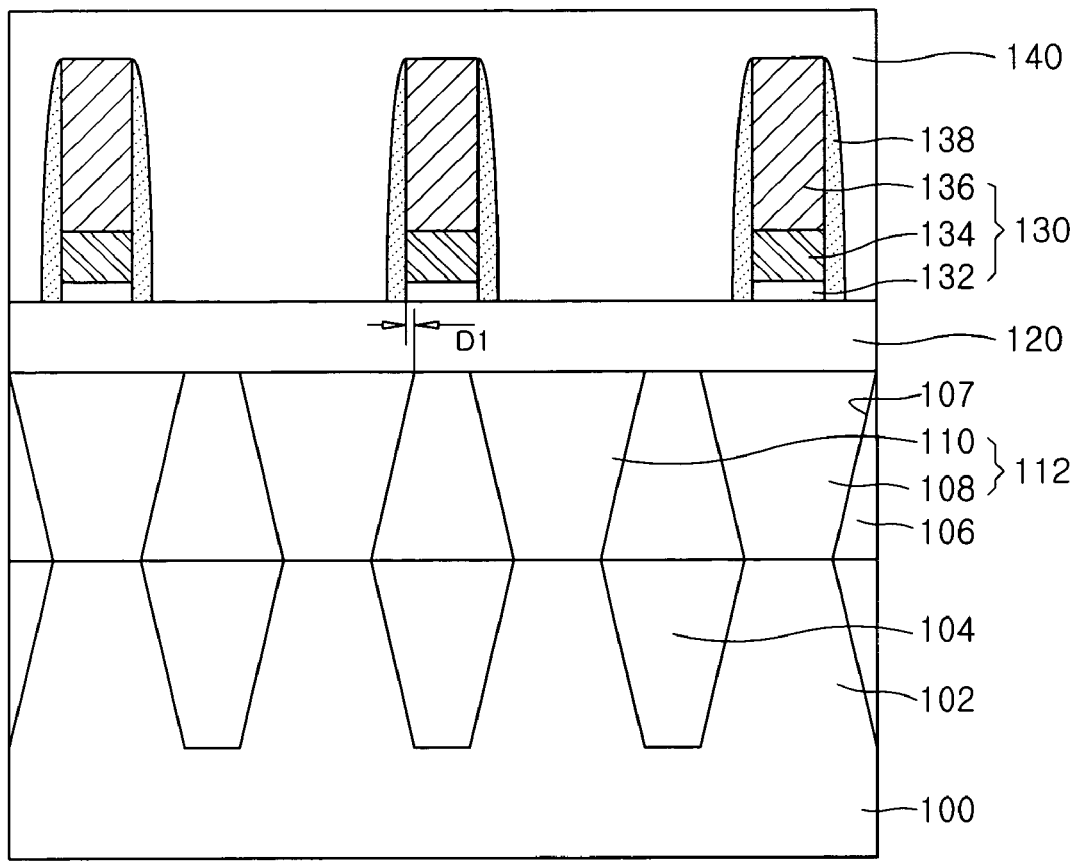

Referring now to FIG. 7, a second interlayer insulating layer 120 is formed on the first interlayer insulating layer 106 including the contact pads 112. In order to form a planar upper surface, the second interlayer insulating layer 120 may be formed of boron-phosphite silicate glass (BPSG). A bitline 130 is then formed on the second interlayer insulating layer 120. The bitline 130 may be on and/or may overlap at least a portion of the upper surface of the lower electrode contact pad 110.

The bitline 130 may be formed as follows: first, an adhesive layer 132 (composed of Ti, TiN, and/or a combination of the two), a bitline conductor 134, and a bit line mask layer 136 are sequentially formed on the second interlayer insulating layer 120. Then, a first photoresist pattern (not shown) for defining the bitline 130 is formed on the bit line mask layer 136. The bitline mask layer 136, the bitline conductor 134, and the adhesive layer 132 are then sequentially removed using the first photoresist pattern as a mask to form the bitline 130.

Subsequently, portions of the second interlayer insulating layer 120 that are exposed by the bitline 130 are blanketed with silicon nitride (not shown). The silicon nitride is then anisotropically dry etched to form first insulating spacers 138 on both sidewalls of the bitline 130.

The first insulating spacers 138 and the exposed portions of second interlayer insulating layer 120 are covered by a gap-filling layer 140. The gap-filling layer 140 may be an insulating layer such as a USG layer, a high density plasma (HDP) oxide layer, a TEOS layer formed using PECVD, an oxide layer formed using PECVD, and/or any combination of the above. In some embodiments, the gap-filling layer 140 may be an HDP oxide layer, which may have a high density and may fill the trench region between the bitlines 130. The HDP oxide layer may be formed by HDP CVD, which is a combination of CVD and sputtering. More particularly, a sputtering gas capable of etching a deposited material layer and a deposition gas used to deposit the material layer may be provided to a chamber.

For example, $SiH_4$ and $O_2$ may be provided as a deposition gas, and an inert gas, such as an Ar gas, may be provided as a sputtering gas. The deposition gas and sputtering gas provided may be partially ionized by plasma generated in the chamber using high frequency power. Biased radio frequency power may then be applied to a wafer chuck (such as an electrostatic chuck) placed in a chamber into which the substrate is loaded, and the ionized deposition and sputtering gases may thereby be accelerated onto a surface of the substrate. The accelerated deposition gas ions may form a silicon oxide layer, and the accelerated sputtering gas ions may cause sputtering of the deposited silicon oxide layer. Accordingly, when the gap-filling layer 120 is an HDP oxide layer formed using the methods described above, the gap-filling layer 120 may have a high density and excellent gap-filling characteristics.

Figure 8:
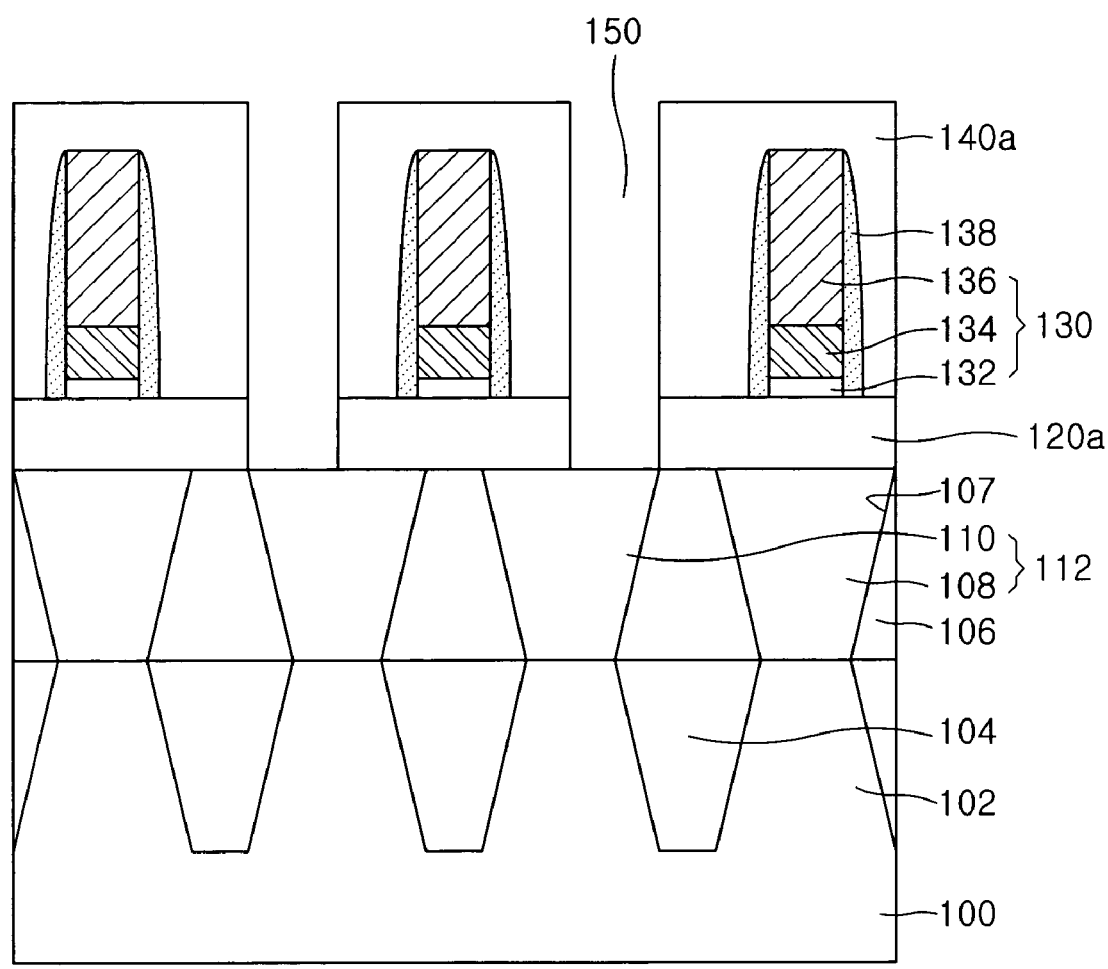

Referring now to FIG. 8, a contact opening 150 exposing the lower electrode contact pad 110 is formed using conventional methods. The lower electrode contact pad 110 may function as an etch stop layer. The contact opening 150 is defined by a second interlayer insulating layer pattern 120a and a third interlayer insulating layer pattern 140a sequentially stacked on the first interlayer insulating layer 106. The third interlayer insulating layer pattern 140a encloses the bitline 130. Sidewalls of the second interlayer insulating layer pattern 120a are aligned with sidewalls of the third interlayer insulating layer 140a.

Figure 9:
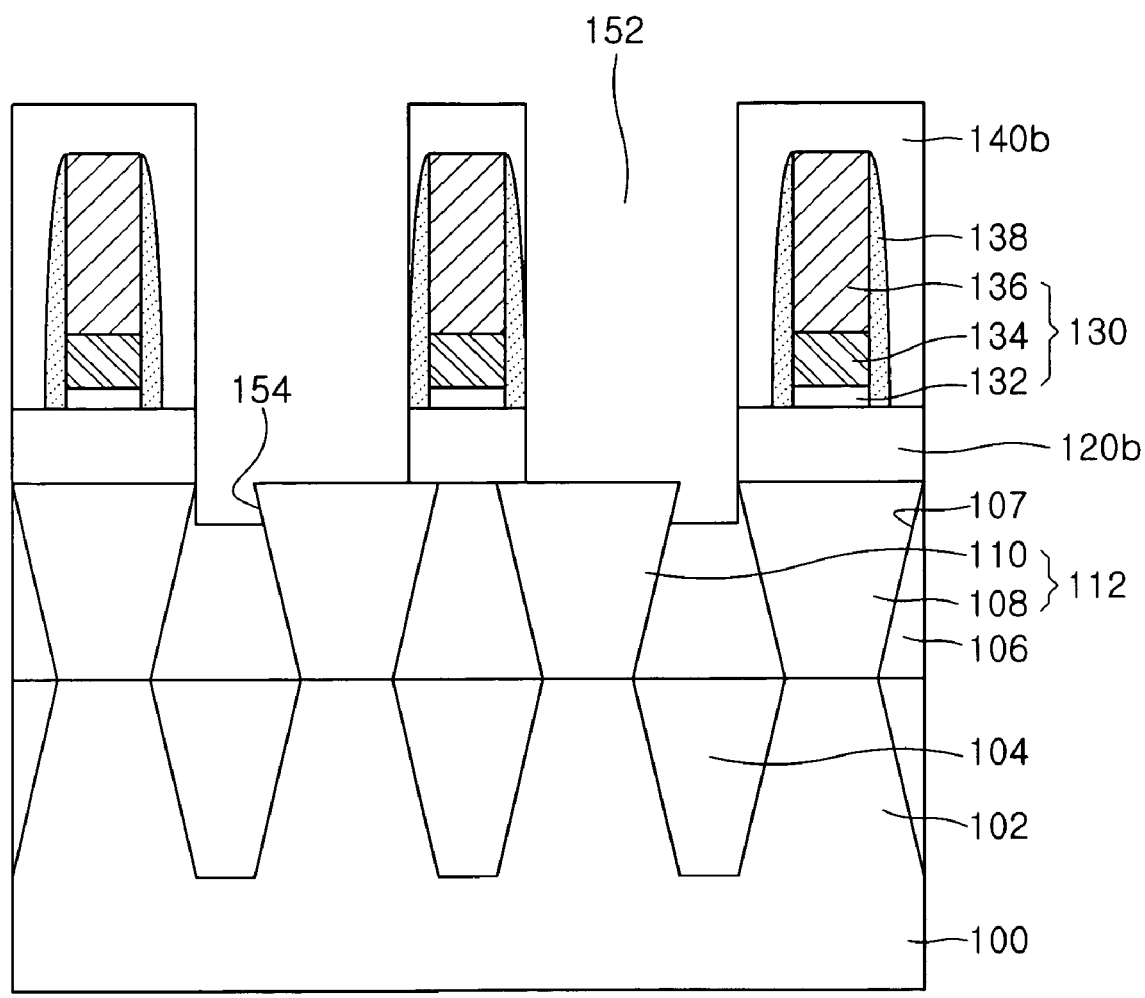

Referring to FIG. 9, the contact opening 150 is widened by wet etching upper surfaces and sidewalls of the third interlayer insulating layer pattern 140a and sidewalls of the second interlayer insulating layer pattern 120a, thereby forming a widened contact opening 152. When the widened contact opening 152 is formed, the lower electrode contact pad 110 may function as an etch stop layer. The first insulating spacer 138 may also function as an etch stop layer for horizontal etching of the third interlayer insulating layer pattern 140a. The etch selectivity of the second and third interlayer insulating layer patterns 120a and 140a to the first interlayer insulating layer 106 may be in the range of about 1:0.5 to 1:5. At this time, sidewalls of the second interlayer insulating layer pattern 120b and the third interlayer insulating layer pattern 140b may be aligned. The wet etchant may be a diluted HF, $NH_4F$, and/or a buffered oxide etchant (BOE) of HF and a deionized water.

When the wet etching process is completed, a recess 154 is formed in an upper portion of the first interlayer insulating layer 106 adjacent a sidewall of the lower electrode contact pad 110. The shape of the recess 154 is defined by the shape of the lower electrode contact pad 110. In some embodiments, the sidewalls of the recess 154 are oblique, such that an upper portion of the recess 154 may be narrower than a lower portion thereof. The width of the recess 154 may be less than or equal to a difference between the diameter of the widened contact opening 152 and the diameter of the contact opening 150.

Figure 10:
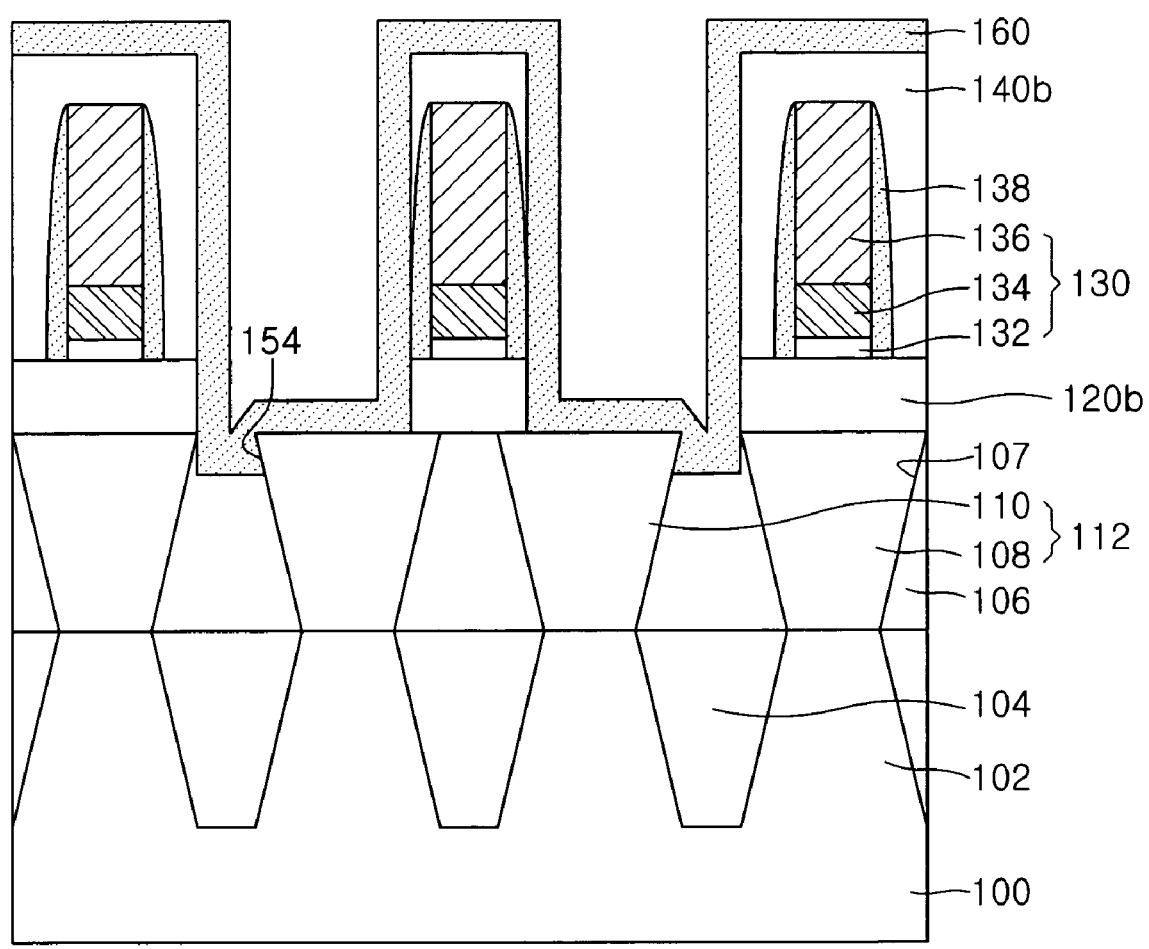

Referring now to FIG. 10, after the widened contact opening 152 is formed, inner surfaces of the widened contact opening 152 including sidewalls of the second and third interlayer insulating patterns 120b and 140b and upper surfaces of the third interlayer insulating layer pattern 140b are blanketed with a silicon nitride layer 160.

Figure 11:
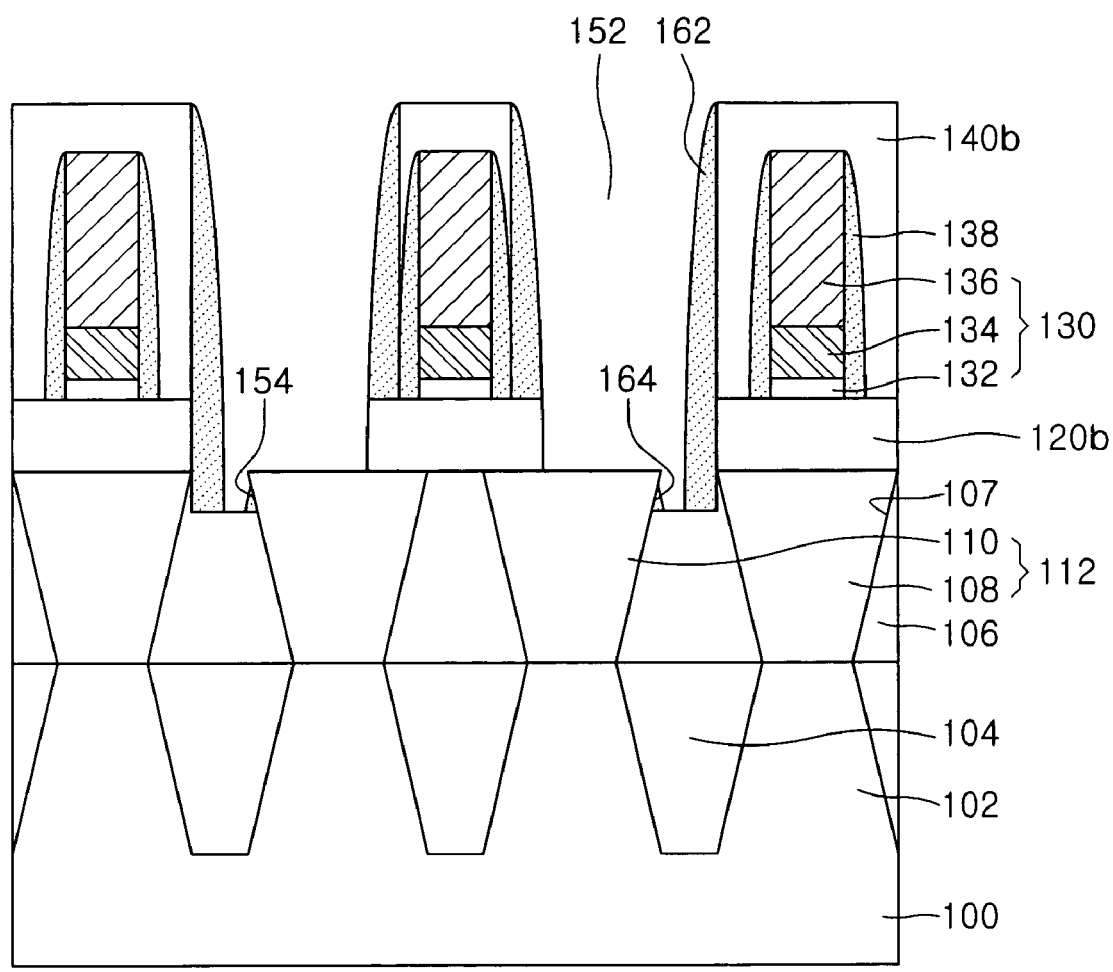

Referring to FIG. 11, the silicon nitride layer 160 is anisotropically dry etched to form second insulating spacers 162 covering sidewalls of the bitline conductor 130 at inner sidewalls of the widened contact opening 152 and a sidewall portion of the lower electrode contact pad 110 in the recess 154.

Figure 12:
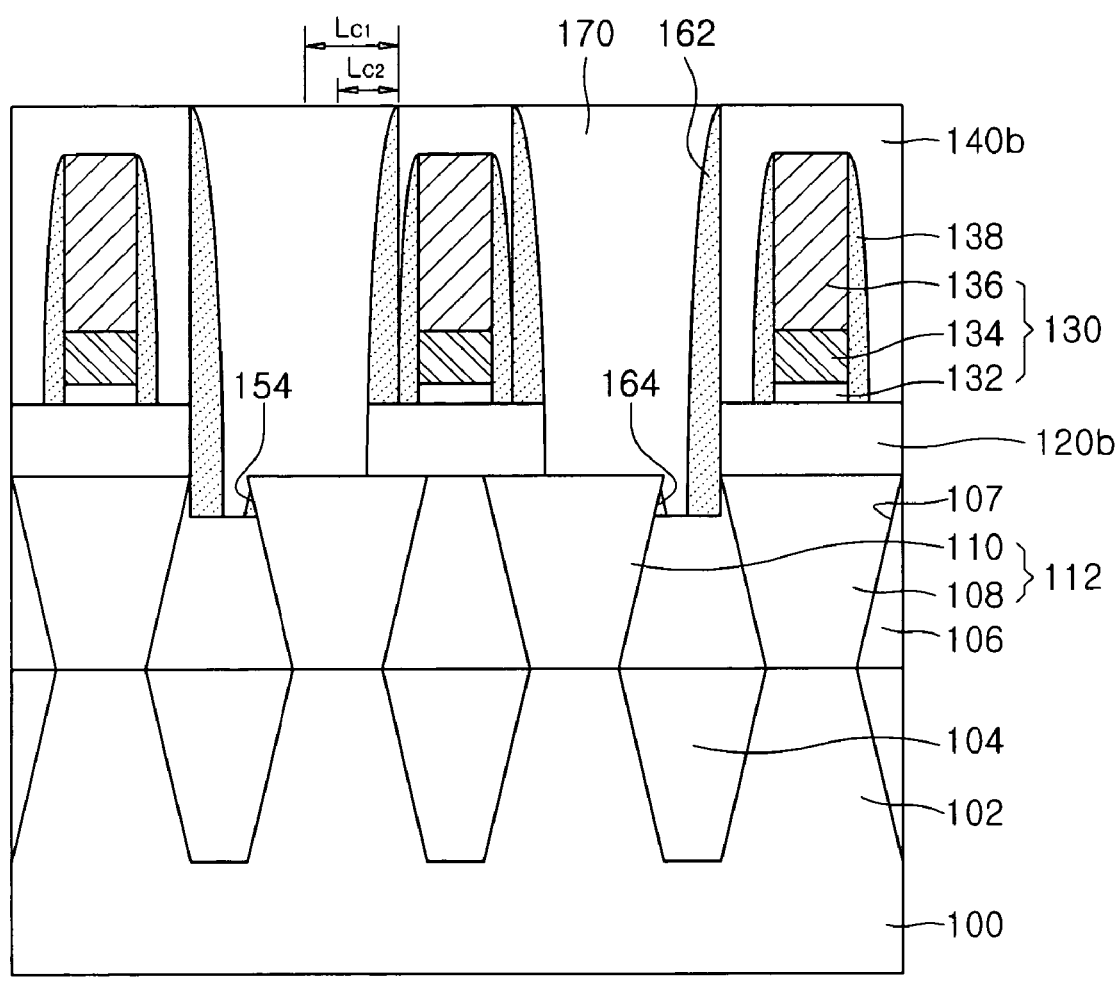

Referring now to FIG. 12, the widened contact opening 152 (in which the second insulating spacers 162 are formed) is filled with a conductive material to form a lower electrode contact plug 170. The lower electrode contact plug 170, which is separated from the bitline 130 by the first insulating spacer 138 and the second insulating spacer 162, is formed on at least a portion of the lower electrode contact pad 110 at an upper surface and at one sidewall thereof. A distance $L_{C1}$ between a sidewall of the bitline 130 and the center C1 of the lower electrode contact plug 170 is greater than a distance $L_{C2}$ between the sidewall of the bitline 130 and the center C2 of the lower electrode contact pad 110.

A residual insulating layer 164 may remain in the recess 154 between the lower electrode contact plug 170 and the lower electrode contact pad 110 as an artifact of the process for forming the second insulating spacers 162. However, according to some embodiments of the present invention, the contact area between the lower electrode contact plug 170 and the lower electrode contact pad 110 is increased based on the surface area of the sidewalls of the lower electrode contact pad 170 exposed by the recess 154 (in which the residual insulating layer layer 164 and the second insulating spacer 162 are formed). As such, contact resistance may be reduced. In addition, the first insulating spacer 138 and the second insulating spacer 162 separate the lower electrode contact plug 170 from the bitline conductor 130 by a distance which may be sufficient to prevent electrical contact between the bitline 130 and the lower electrode contact pad 170.

Figure 13:
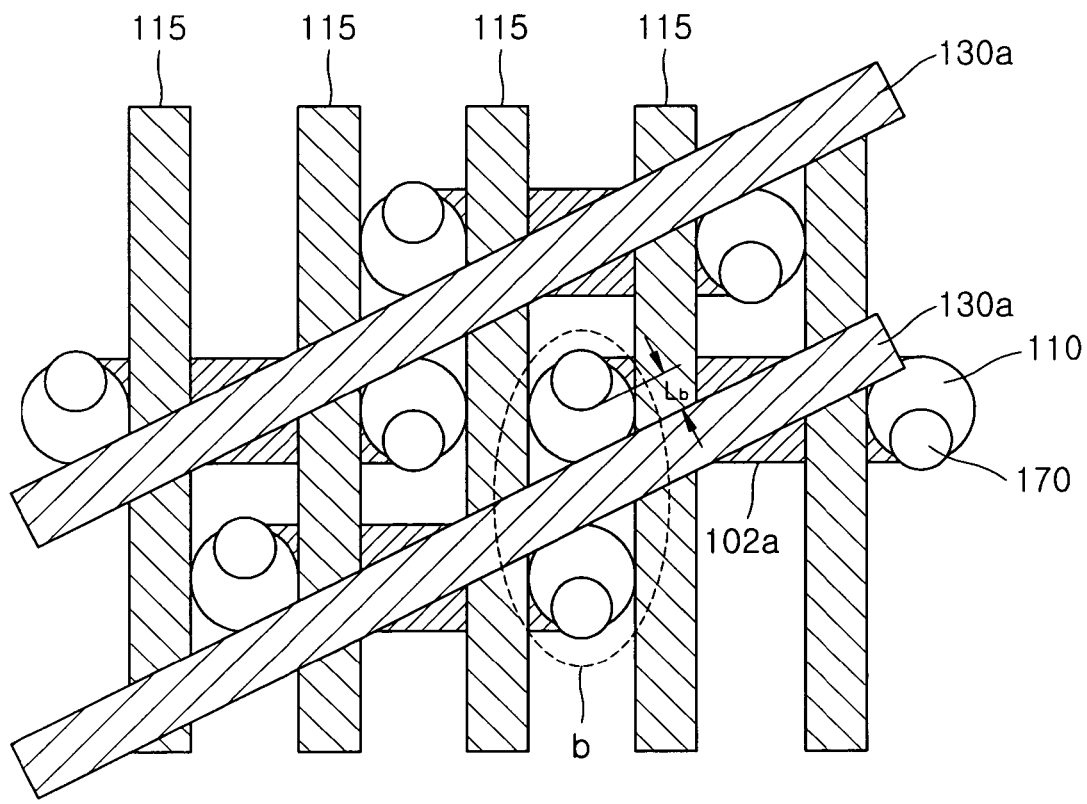
FIG. 13 is a plan view of a semiconductor memory device including lower electrode contact structures according to further embodiments of the present invention.
Figure 14:
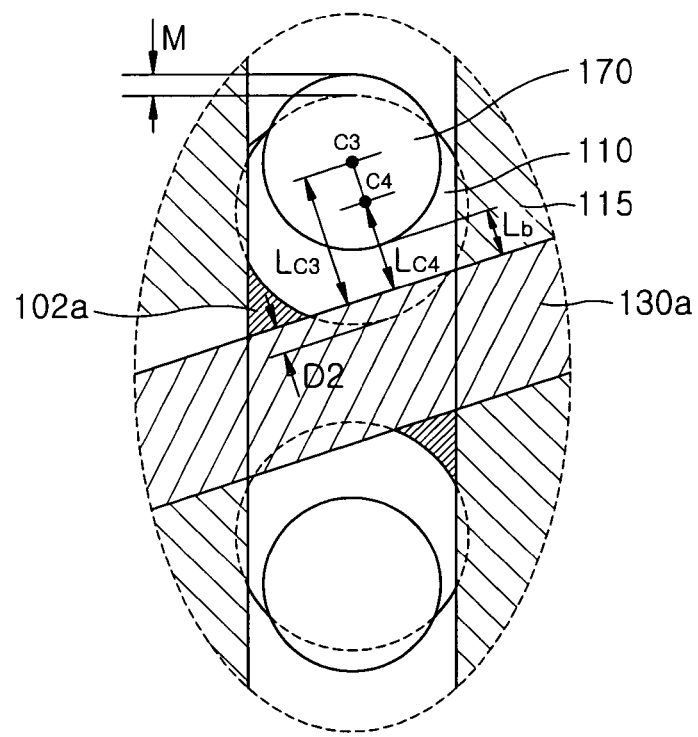
FIG. 14 is an enlarged view of a portion "b" of FIG. 13.

FIG. 13 is a plan view of a semiconductor memory device including lower electrode contact structures according to further embodiments of the present invention. FIG. 14 is an enlarged view of a portion "b" of FIG. 13. Methods of forming a lower electrode contact pad 110 and a lower electrode contact plug 170 in the present embodiment may be similar to those described above; however, the structure and/or layout of an active region 102a and a bitline 130a as shown in FIGS. 13 and 14 may differ.

Referring now to FIGS. 13 and 14, the lower electrode contact pad 110 and the lower electrode contact plug 170 are formed at ends of the active region 102a. The active region 102a extends at an oblique angle relative to the bitline 130a. A word line 115 extends perpendicular to the active region 102a.

As shown in FIG. 14, the bitline 130a overlaps a portion of the lower electrode contact pad 110 by a width D2. The lower electrode contact plug 170, which is separated from the bitline 130 by a predetermined distance $L_b$, is formed on the lower electrode contact pad 110. A distance $L_{C3}$ between a sidewall of the bitline 130a and the center C3 of the lower electrode contact plug 170 is greater than a distance $L_{C4}$ between the sidewall of the bitline 130a and the center C4 of the lower electrode contact pad 110. As discussed above, due to the surface area of the sidewall of the lower electrode conductive pad 110 that is exposed by the recess 154, a sufficient contact area between the lower electrode contact plug 170 and the lower electrode contact pad 110 can be maintained even when a misalignment M (i.e., overhang) of the lower electrode contact plug 170 relative to the lower electrode contact pad 110 is greater than about 15 nm. In other words, contact resistance may not be increased even where the lower electrode conductive plug 170 extends beyond an edge of the lower electrode conductive pad 110 by more than about 15 nm.

Thus, according to some embodiments of the present invention, the contact area between the lower electrode contact plug 170 and the lower electrode contact pad 110 may be increased by as much as the surface area of the exposed sidewall of the lower electrode contact plug 17 that is exposed by the recess 154. Accordingly, contact resistance between the lower electrode contact plug 170 and the lower electrode contact pad 110 may be decreased. In addition, the first insulating layer spacer 138 and the second insulating layer spacer 162 may separate the lower electrode contact plug 170 from the bitline conductor 130 by a distance sufficient to prevent and/or reduce the likelihood of an electric short between the bitline 130 and the lower electrode contact plug 170.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of fabricating a semiconductor memory device, the method comprising:
   forming an insulating layer on a semiconductor substrate having an active region therein;
   forming a lower electrode conductive pad extending through the insulating layer and electrically contacting the active region at a lower surface thereof;
   forming a bitline conductor on the semiconductor substrate and on at least a portion of an upper surface of the lower electrode conductive pad;
   forming a recess in the insulating layer adjacent to a sidewall of the lower electrode conductive pad:
   forming a residual insulating layer on at least a portion of the sidewall of the lower electrode conductive pad in the recess; and
   forming a lower electrode conductive plug on at least a portion of the lower electrode conductive pad opposite the bitline conductor and contacting the lower electrode conductive pad at the upper surface and at one sidewall thereof;
   wherein the residual insulating layer is between the lower electrode conductive plug and the sidewall of the lower electrode conductive pad.

2. The method of claim 1, further comprising:
   forming an insulating spacer on a sidewall of the bitline conductor, wherein the insulating spacer separates the bitline conductor from the lower electrode conductive plug by a distance sufficient to prevent electrical contact therebetween.

3. The method of claim 2, wherein forming an insulating spacer comprises:
   forming a first insulating spacer on the sidewall of the bitline conductor; and
   forming a second insulating spacer on the sidewall of the bitline conductor adjacent the first insulating spacer,
   wherein the first insulating spacer and the second insulating spacer separate the bitline conductor from the lower electrode conductive plug by a distance sufficient to prevent electrical contact therebetween.

4. The method of claim 1, wherein forming a lower electrode conductive plug comprises:
   forming a recess in the insulating layer adjacent the sidewall of the lower electrode conductive pad; and forming the lower electrode conductive plug in the recess in the insulating layer and electrically contacting the lower electrode conductive pad at the upper surface and sidewall thereof.

5. The method of claim 4, wherein forming a lower electrode conductive pad comprises:

forming a lower electrode conductive pad having oblique sidewalls to the upper surface of the lower electrode conductive pad, wherein the upper surface of the lower electrode conductive pad is wider than the lower surface thereof.

6. The method of claim 4, wherein the insulating layer comprises a first interlayer insulating layer, the method further comprising:

forming a second interlayer insulating layer on the substrate prior to forming the bitline conductor; and forming a third interlayer insulating layer on an upper surface and sidewalls of the bitline conductor.

7. The method of claim 6, wherein forming a recess in the insulating layer comprises:

selectively etching the third, second, and first interlayer insulating layers, wherein the etch selectively of the second and third interlayer insulating layer relative to that of the first interlayer insulating layer is about 1:0.5 to 1:5.

8. The method of claim 1, wherein forming the lower electrode conductive plug comprises:

forming the lower electrode conductive plug on the lower electrode conductive pad and extending beyond an edge of the lower electrode conductive pad by more than about 15 nm, wherein a distance between the bitline conductor and a center of the lower electrode conductive plug is greater than a distance between the bitline conductor and a center of the lower electrode conductive pad.

9. The method of claim 1, wherein forming a bitline conductor comprises:

forming the bitline conductor oblique relative to the active region of the semiconductor substrate.

10. A method of fabricating a semiconductor memory device, the method comprising:

forming an insulating layer on a semiconductor substrate having an active region therein;

forming a lower electrode conductive pad extending through the insulating layer and electrically contacting the active region at a lower surface thereof, the lower electrode conductive pad having oblique sidewalls to an upper surface thereof that is wider than the lower surface thereof;

forming a bitline conductor on the semiconductor substrate;

forming a recess in the insulating layer adjacent a sidewall of the lower electrode conductive pad;

forming an insulating spacer in the recess in the insulating layer and forming a residual insulating layer on at least a portion of the sidewall of the lower electrode conductive pad in the recess; and forming a lower electrode conductive plug in the recess in the insulating layer on at least a portion of the lower electrode conductive pad and contacting the lower electrode conductive pad at an upper surface and at one sidewall thereof;

wherein the residual insulating layer is between the lower electrode conductive plug and the sidewall of the lower electrode conductive pad.

11. The method of claim 10, wherein forming the insulating spacer and the residual insulating layer in the recess comprises:

forming a silicon nitride layer on the sidewall of the bitline conductor and in the recess in the insulating layer; and removing at least a portion of the silicon nitride layer from the recess using an anisotropic etching process to form the insulating spacer in the recess in the insulating layer and to form the residual insulating layer in the recess in the insulating layer adjacent the sidewall of the lower electrode conductive pad.

* * * * *